(12) United States Patent
Kong et al.

(10) Patent No.: US 10,903,421 B2
(45) Date of Patent: Jan. 26, 2021

(54) CONTROLLING FILAMENT FORMATION AND LOCATION IN A RESISTIVE RANDOM-ACCESS MEMORY DEVICE

(71) Applicant: International Business Machines Corporation, Armonk, NY (US)

(72) Inventors: Dexin Kong, Guilderland, NY (US); Juntao Li, Cohoes, NY (US); Takashi Ando, Tuckahoe, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/148,510

(22) Filed: Oct. 1, 2018

(65) Prior Publication Data

US 2020/0106010 A1     Apr. 2, 2020

(51) Int. Cl.
*H01L 45/00* (2006.01)
*H01L 27/24* (2006.01)

(52) U.S. Cl.
CPC ...... *H01L 45/1206* (2013.01); *H01L 27/2463* (2013.01); *H01L 45/08* (2013.01); *H01L 45/1233* (2013.01); *H01L 45/1273* (2013.01); *H01L 45/1675* (2013.01)

(58) Field of Classification Search
CPC .................................................. H01L 45/1675
USPC .......................................................... 438/467
See application file for complete search history.

(56) References Cited

U.S. PATENT DOCUMENTS

| 6,849,891 | B1 | 2/2005 | Hsu et al. |
| 8,930,174 | B2 | 1/2015 | Lu |
| 9,047,940 | B2 | 6/2015 | Nardi et al. |
| 9,246,085 | B1 | 1/2016 | Wang |
| 9,478,740 | B2 | 10/2016 | Sandhu |
| 9,530,493 | B2 | 12/2016 | Eleftheriou et al. |
| 9,620,205 | B2 | 4/2017 | Nardi et al. |

(Continued)

FOREIGN PATENT DOCUMENTS

| CN | 1652319 A | 8/2005 |
| CN | 101257086 A | 9/2008 |

(Continued)

OTHER PUBLICATIONS

T.-C. Chang et al., "Resistance Random Access Memory," Materials Today, Jun. 2016, pp. 254-264, vol. 19, No. 5.

(Continued)

*Primary Examiner* — Hsin Yi Hsieh
(74) *Attorney, Agent, or Firm* — Randall Bluestone; Ryan, Mason & Lewis, LLP

(57) ABSTRACT

A method for manufacturing a semiconductor memory device includes forming a bottom electrode on a bottom contact layer, and forming a dielectric layer covering sides of the bottom electrode. In the method, a switching element layer is deposited on the dielectric layer and the bottom electrode, a top electrode layer is deposited on the switching element layer, and a hardmask layer is deposited on the top electrode layer. The switching element, top electrode and hardmask layers are patterned into a pillar on the bottom electrode. The method further includes forming a spacer layer on the dielectric layer on sides of the pillar, and forming a metal layer on the dielectric layer adjacent the spacer layer and around the pillar.

13 Claims, 13 Drawing Sheets

(56) References Cited

U.S. PATENT DOCUMENTS

| | | |
|---|---|---|
| 9,647,207 B2 | 5/2017 | Trinh et al. |
| 9,865,813 B2 | 1/2018 | Fest |
| 9,978,938 B2 | 5/2018 | Trinh et al. |
| 9,985,203 B2 | 5/2018 | Chen et al. |
| 10,043,973 B2 | 8/2018 | Kwon et al. |
| 2006/0270245 A1 | 11/2006 | Conti et al. |
| 2014/0264238 A1 | 9/2014 | Jo |
| 2016/0163586 A1* | 6/2016 | Siew ............... H01L 21/76844 438/653 |
| 2018/0151646 A1* | 5/2018 | Kim .................. H01L 27/3246 |
| 2019/0296231 A1* | 9/2019 | He ......................... H01L 45/16 |
| 2020/0006649 A1* | 1/2020 | Jiang .................. H01L 45/1675 |

FOREIGN PATENT DOCUMENTS

| | | |
|---|---|---|
| KR | 101113014 B1 | 2/2012 |
| WO | 2017111930 A1 | 6/2017 |

OTHER PUBLICATIONS

R. DeGraeve et al., "Dynamic 'Hour Glass' Model for SET and RESET in HfO2 RRAM," Symposium on VLSI Technology Digest of Technical Papers, Jun. 12-14, 2012, pp. 75-76.

S. Zafar et al., "Measurement of Oxygen Diffusion in Nanometer Scale HfO2 Gate Dielectric Films," Applied Physics Letters, Mar. 2011, 3 pages, vol. 98, No. 15.

T. Ando et al., "Understanding and Mitigating High-k Induced Device Width and Length Dependencies for FinFET Replacement Metal Gate Technology," IEEE International Electron Devices Meeting (IEDM), Dec. 7-9, 2015, pp. 568-571.

\* cited by examiner

100

100

100

200

CONTROLLING FILAMENT FORMATION AND LOCATION IN A RESISTIVE RANDOM-ACCESS MEMORY DEVICE

BACKGROUND

Memory cells may include, for example, phase-change random-access memory (PCRAM), resistive random-access memory (RRAM or ReRAM), magnetic random-access memory (MRAM), and/or fuse/anti-fuse devices. RRAM devices have a three-layer structure of a top electrode, switching medium and bottom electrode. Selector devices may include, for example, diodes (e.g., unipolar or bipolar), and other 2-terminal (e.g., ovonic threshold switch (OTS)) or 3-terminal devices (e.g. field-effect transistors (FETs) and bipolar junction transistors (BJTs)).

A resistance switching mechanism utilizes a filament formed in the switching material upon application of a voltage to the two electrodes. Switching material can include, for example, hafnium oxide ($HfO_2$). During formation of an RRAM device, the filament is randomly formed within a switching material (e.g., $HfO_2$) layer. With increased miniaturization and shrinking cell size, undesirable edge effects are becoming more obvious. For example, non-linear analog switching is caused by the abrupt movement of switching elements near the highest/lowest conductance ranges and consequent filament growth in horizontal-direction.

Accordingly, there is a need to control filament formation location inside RRAM cells to limit the impact of edge effects so that variations in filament formation will be reduced.

SUMMARY

According to an exemplary embodiment of the present invention, a method for manufacturing a semiconductor memory device includes forming a bottom electrode on a bottom contact layer, and forming a dielectric layer covering sides of the bottom electrode. In the method, a switching element layer is deposited on the dielectric layer and the bottom electrode, a top electrode layer is deposited on the switching element layer, and a hardmask layer is deposited on the top electrode layer. The switching element, top electrode and hardmask layers are patterned into a pillar on the bottom electrode. The method further includes forming a spacer layer on the dielectric layer on sides of the pillar, and forming a metal layer on the dielectric layer adjacent the spacer layer and around the pillar.

According to an exemplary embodiment of the present invention, a semiconductor memory device includes a plurality of memory cells disposed on a plurality of bottom contact lines. Each of the plurality of memory cells includes a bottom electrode disposed on a bottom contact line of the plurality of bottom contact lines, a switching element layer disposed on the bottom electrode, and a top electrode disposed on the switching element layer. In the memory device, a plurality of top contact lines are disposed on the plurality of memory cells, and an additional electrode surrounds the plurality of memory cells.

According to an exemplary embodiment of the present invention, a method for manufacturing a semiconductor memory device includes forming a plurality of bottom electrodes spaced apart from each other on a plurality of bottom contact layers, and forming a dielectric layer covering sides of the plurality of bottom electrodes. In the method, a switching element layer is deposited on the dielectric layer and the plurality of bottom electrodes, a top electrode layer is deposited on the switching element layer, and a hardmask layer is deposited on the top electrode layer. The switching element, top electrode and hardmask layers are patterned into a plurality of pillars respectively on each bottom electrode of the plurality of bottom electrodes. The method further includes forming a plurality of spacer layers on the dielectric layer on sides of the plurality of pillars, and forming a metal layer on the dielectric layer adjacent the plurality of spacer layers and around the plurality of pillars.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
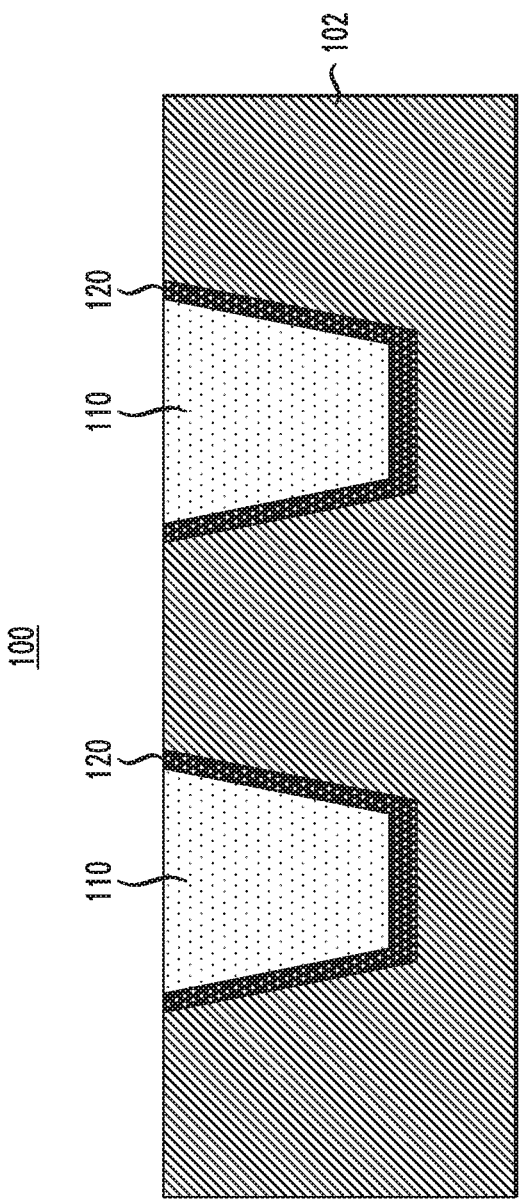
FIG. 1 is a schematic cross-sectional view illustrating manufacturing of a memory device and showing formation of bottom contacts in a dielectric layer, according to an embodiment of the invention.

Exemplary embodiments of the invention will now be discussed in further detail with regard to semiconductor devices and methods of manufacturing same and, in particular, to methods and structures to control filament formation and location in RRAM devices with an electrode that surrounds memory cells.

It is to be understood that the various layers and/or regions shown in the accompanying drawings are not drawn to scale, and that one or more layers and/or regions of a type commonly used in, for example, phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCRAM, RRAM, 3D RRAM, MRAM, fuses/antifuses, diodes, OTSs, BJTs, FETs, CMOSs, MOSFETs, nanowire FETs, nanosheet FETs and/or FinFETs. By way of non-limiting example, the semiconductor devices can include, but are not limited to PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

As used herein, a "3D cross-point" or "3D cross-bar" structure includes a three-dimensional configuration of memory cells at the intersection of wordlines and bitlines. In the structure, each of the memory cells can be addressed individually, so that data can be written and read in small sizes.

In accordance with an embodiment of the present invention, a third electrode is provided around an RRAM cell structure of a top electrode, switching medium and bottom electrode in order to introduce a lateral electric field which modulates the trajectories of metal ions to control filament formation location in the RRAM cell. More specifically, the third electrode functions as a focusing electrode to limit filament growth to the center of the RRAM cell, which minimizes edge effects. By adding an additional metal electrode surrounding the switching medium, as a gate terminal in a field-effect transistor (FET), and building a 3-terminal resistive memory device, the lateral electric field can be tuned by applying proper voltage.

For set/reset operations, embodiments of the present invention suppress filament growth (e.g., rupture) by applying an electric field from the third electrode in the opposite direction of filament growth to push oxygen vacancies to the center of the RRAM cell (e.g., center of the switching layer) and alleviate abrupt filament geometry changes. In accordance with one or more embodiments of the present invention, the third electrode is ring-shaped (e.g., circular, oval) and formed around the RRAM device to control filament formation and location in the switching layer. The RRAM device has a bottom electroless structure, utilizing, for example, highly directional physical vapor deposition (PVD) titanium nitride (TiN) as a bottom electrode of the RRAM cell.

The RRAM structure of the embodiments of the present invention eliminates the chance of shorting between top and bottom electrodes due to metal redeposition during bottom electrode metal etching, and provides significant benefits, especially for smaller sized RRAM structures where edge effects become obvious during filament formation.

FIG. 1 is a schematic cross-sectional view illustrating manufacturing of a memory device and showing formation of bottom contacts in a dielectric layer, according to an embodiment of the invention. Referring to FIG. 1, one or more openings (e.g., trenches) are formed in a dielectric layer 102, such as, for example, silicon dioxide ($SiO_2$), carbon-doped silicon oxide (SiCOH), SiLK® dielectrics, and porous forms of these low-k dielectric films. The trenches can be defined using, for example, lithography techniques, and then reactive ion etching (RIE) to open the trenches.

As can be understood by one of ordinary skill in the art, the dielectric layer 102 can be on a semiconductor substrate (not shown), with intervening layers between the dielectric layer 102 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

A barrier layer 120 comprising, for example tantalum nitride, is conformally formed on the sidewall and bottom surfaces of the trenches. Deposition can be performed using, for example, atomic layer deposition (ALD). Other deposition processes, such as, for example, chemical vapor deposition (CVD) or physical vapor deposition (PVD) may also be used.

Figure 13:
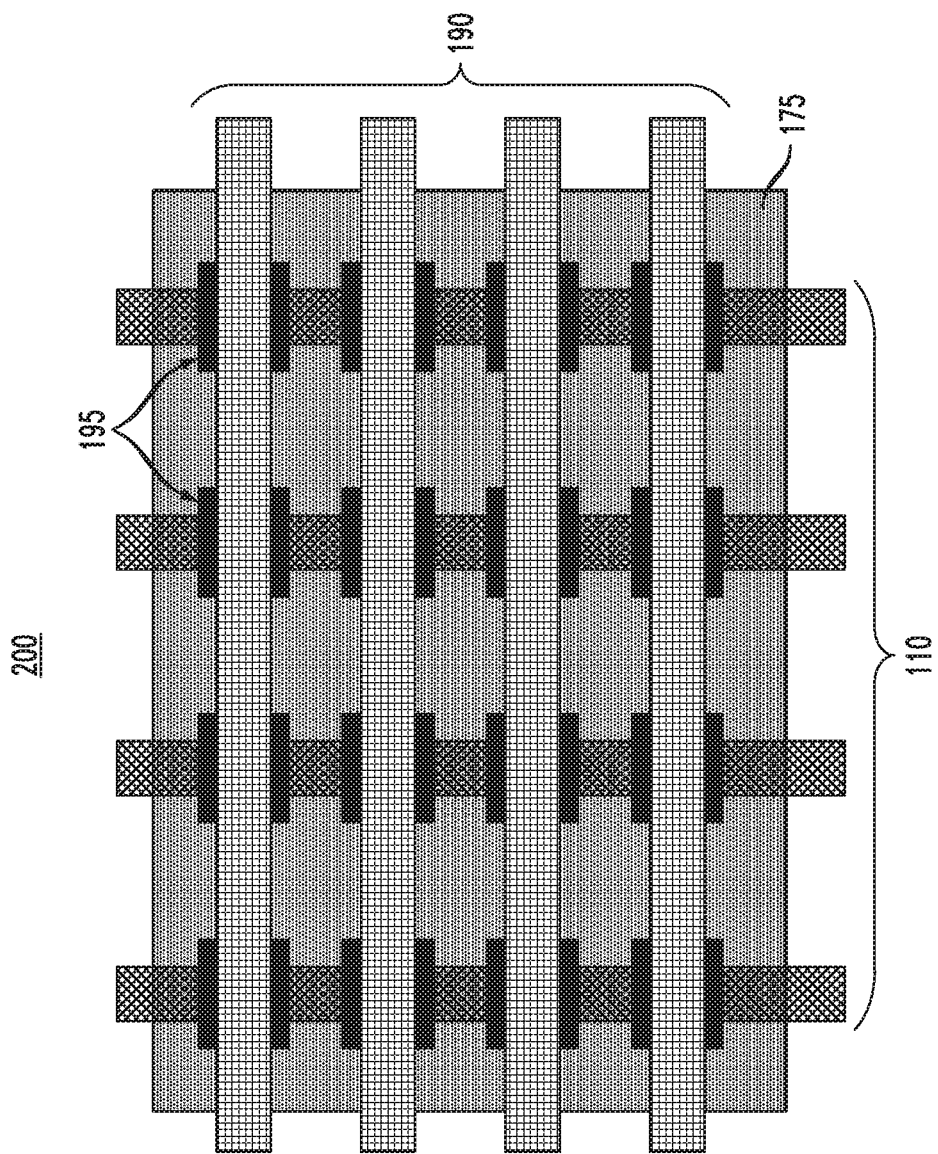
FIG. 13 is a schematic top view of an array of memory cells, according to an embodiment of the invention.

Bottom contacts 110 including, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof are deposited on the barrier layer 120 using deposition techniques, including, but not necessarily limited to, PVD, CVD, ALD or sputtering. The electrically conductive material of the bottom contacts 110 fills in the trenches in the dielectric 102. Additional barrier and contract material layers formed on the top surface of the dielectric 102 are polished off, using for example, a chemical mechanical planarization (CMP) process to planarize the top surface and result in structure shown in FIG. 1. Referring to FIG. 13, the bottom contacts 110 form contact lines, such as, for example, wordlines, of a resulting memory cell array 200. The number of bottom contacts 110 shown in the figures is illustrative, and the embodiments of the present invention are not necessarily limited to the number of contacts shown.

Figure 2:
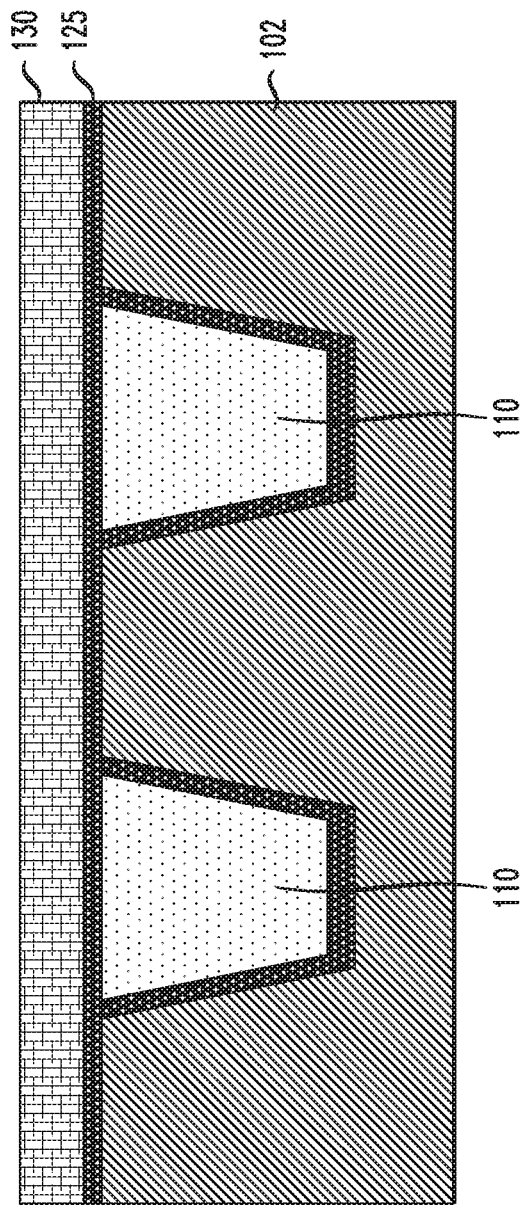
FIG. 2 is a schematic cross-sectional view illustrating manufacturing of a memory device and showing bottom electrode metal layer deposition, according to an embodiment of the invention.

FIG. 2 is a schematic cross-sectional view illustrating manufacturing of a memory device and showing bottom electrode metal layer deposition, according to an embodiment of the invention. Referring to FIG. 2, first and second bottom electrode layers 125 and 130 of a memory device (e.g., RRAM) are deposited on the structure from FIG. 1. In accordance with an embodiment of the present invention, first bottom electrode layer 125 comprises, for example, PVD tantalum nitride (TaN) and the second bottom electrode layer 130 comprises, for example, PVD titanium nitride (TiN). Alternative techniques for depositing the first and second bottom electrode layers 125 and 130 include, for example, ALD and CVD. The first and second bottom electrode layers 125 and 130 deposited by PVD provide better through-put than layers deposited using alternative techniques. Thicknesses (e.g., vertical heights) of the first and second bottom electrode layers 125 and 130 are respectively about 3 nm to about 20 nm and about 10 nm to about 50 nm.

Figure 3:
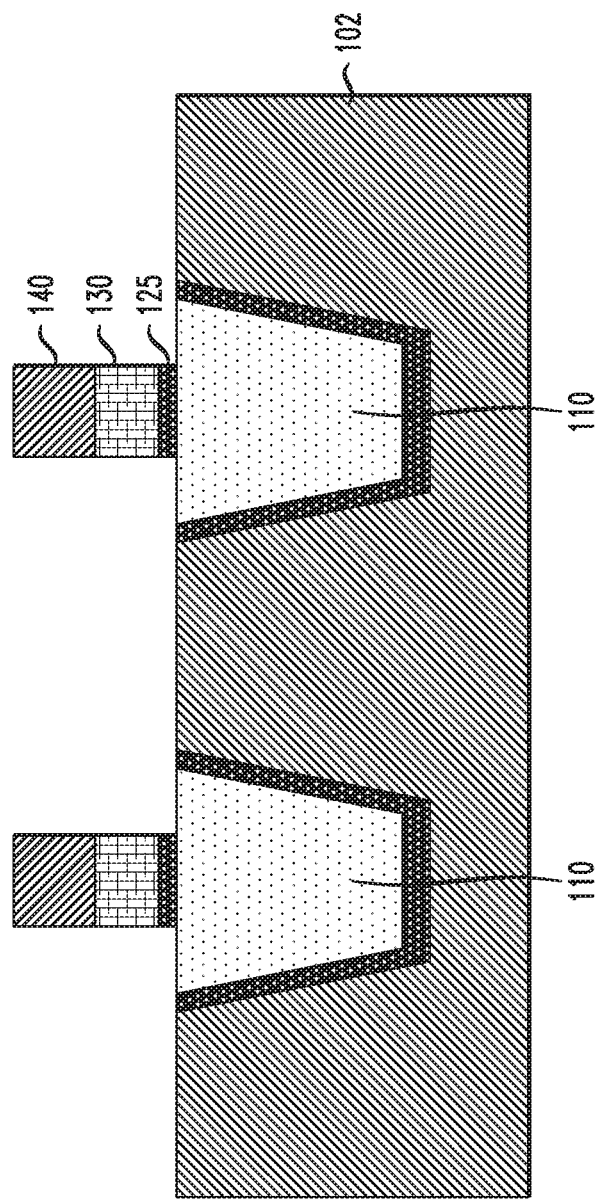
FIG. 3 is a schematic cross-sectional view illustrating manufacturing of a memory device and showing patterning of bottom electrode metal layers into bottom electrodes, according to an embodiment of the invention.

FIG. 3 is a schematic cross-sectional view illustrating manufacturing of a memory device and showing patterning of bottom electrode metal layers into bottom electrodes, according to an embodiment of the invention. Referring to FIG. 3, following deposition of the first and second bottom electrode layers 125 and 130, hardmasks 140 are deposited on portions of the first and second bottom electrode layers 125 and 130 so that exposed portions of the first and second bottom electrode layers 125 and 130 not covered by the hardmasks 140 can be removed by, for example, an etching process using a chlorine-based chemistry. Remaining portions of the first and second bottom electrode layers 125 and 130 form bottom electrode structures under the hardmasks 140. The number of bottom electrode structures shown in the figures is illustrative, and the embodiments of the present invention are not necessarily limited to the number shown. The hardmasks 140 comprise, for example, a nitride, including, but not necessarily limited to, silicon nitride (SiN), silicon boron nitride (SiBN), siliconborocarbonitride (SiBCN) and/or silicon oxycarbonitride (SiOCN). In accordance with an embodiment of the present invention, the hardmask 140 does not comprise an oxide, so as to prevent excess oxygen from reacting with the layers under the hardmask 140.

Figure 4:
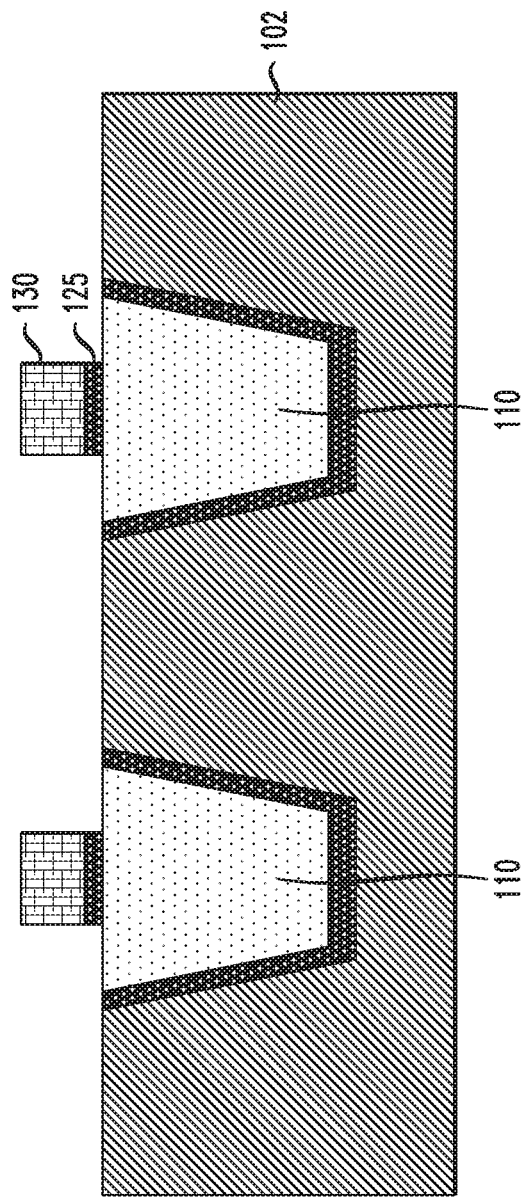
FIG. 4 is a schematic cross-sectional view illustrating manufacturing of a memory device and showing hardmask removal, according to an embodiment of the invention.

FIG. 4 is a schematic cross-sectional view illustrating manufacturing of a memory device and showing hardmask removal, according to an embodiment of the invention. Referring to FIG. 4, the hardmasks 140 are selectively removed using for example, etching with hot phosphorous.

Figure 5:
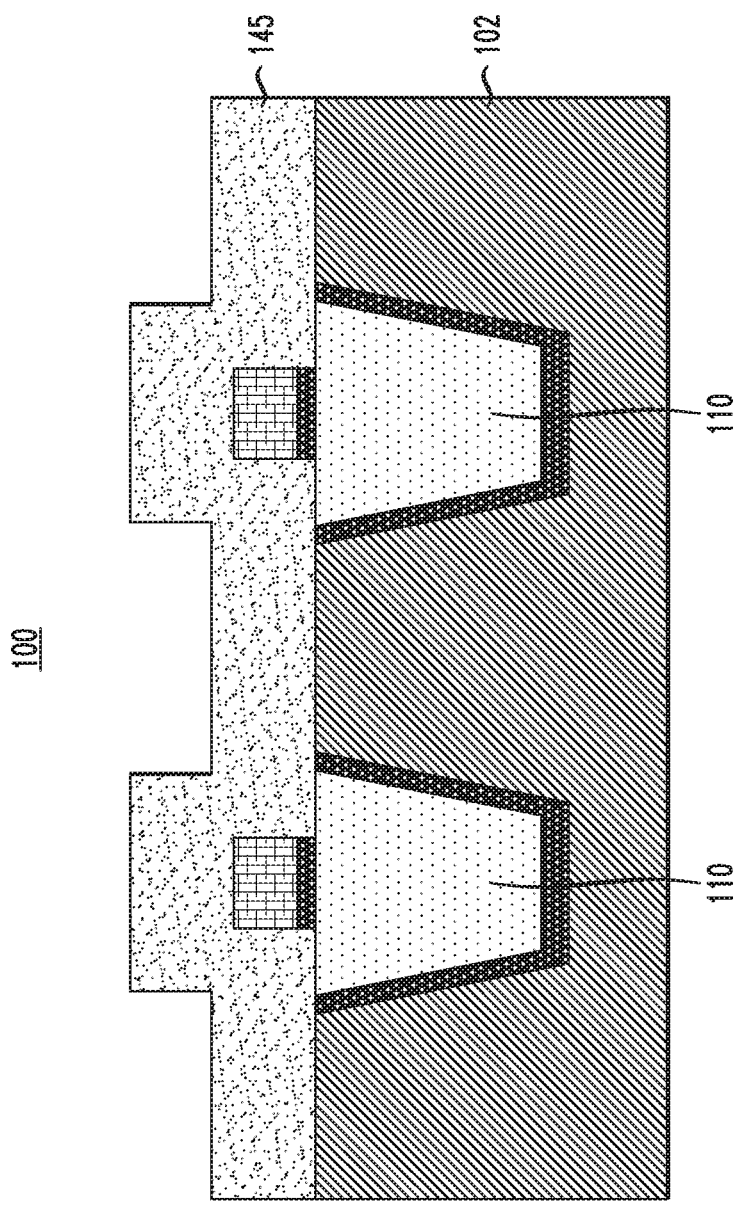
FIG. 5 is a schematic cross-sectional view illustrating manufacturing of a memory device and showing conformal dielectric layer deposition, according to an embodiment of the invention.

FIG. 5 is a schematic cross-sectional view illustrating manufacturing of a memory device and showing conformal dielectric layer deposition, according to an embodiment of the invention. Referring to FIG. 5, a dielectric layer 145 including, for example, SiN, SiBN, SiBCN and/or SiOCN, is conformally deposited on the structure from FIG. 4, including exposed portions of the top surfaces of the dielectric 102, contacts 110 and barrier layers 120, as well as on and around the patterned bottom electrode layers 125 and 130. The conformal deposition is performed using, for example, ALD or other conformal deposition process. In accordance with an embodiment of the present invention, the dielectric layer 145 does not comprise an oxide, so as to prevent excess oxygen from reacting with the bottom electrode layers under the dielectric layer 145. A thickness (e.g., vertical height) of the dielectric layer 145 is greater than a total height of the bottom electrode layers 125 and 130.

Figure 6:
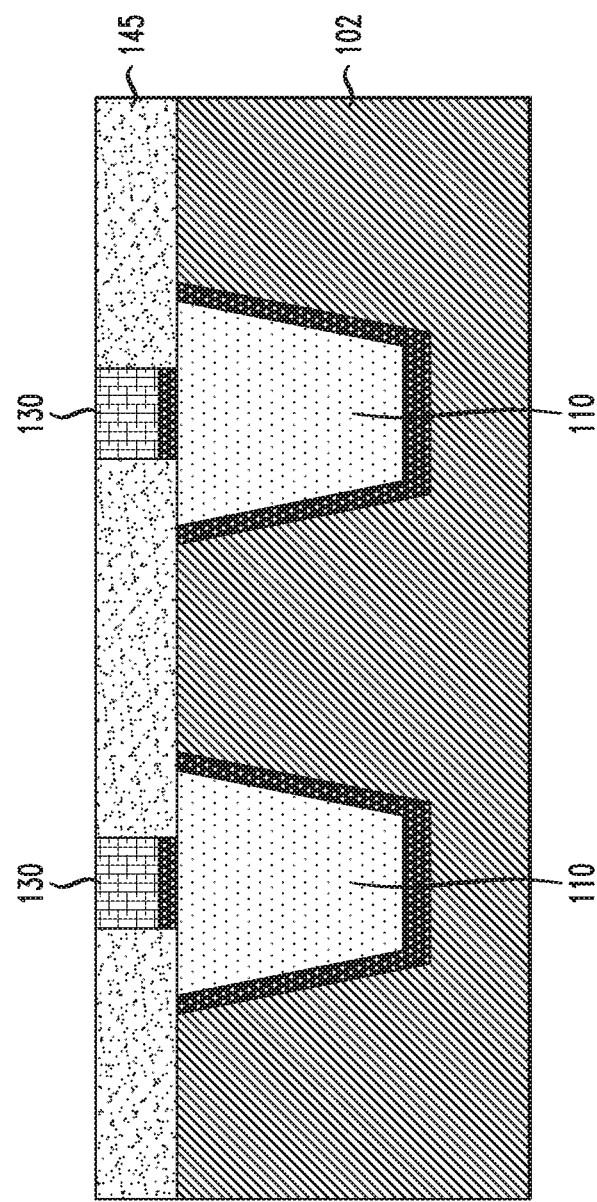
FIG. 6 is a schematic cross-sectional view illustrating manufacturing of a memory device and showing planarization of a deposited conformal dielectric layer, according to an embodiment of the invention.

FIG. 6 is a schematic cross-sectional view illustrating manufacturing of a memory device and showing planarization of a deposited conformal dielectric layer, according to an embodiment of the invention. Referring to FIG. 6, a planarization process is performed using, for example, CMP, to planarize the dielectric layer 145 down to the second electrode layer 130 including, for example, PVD TiN.

Figure 7:
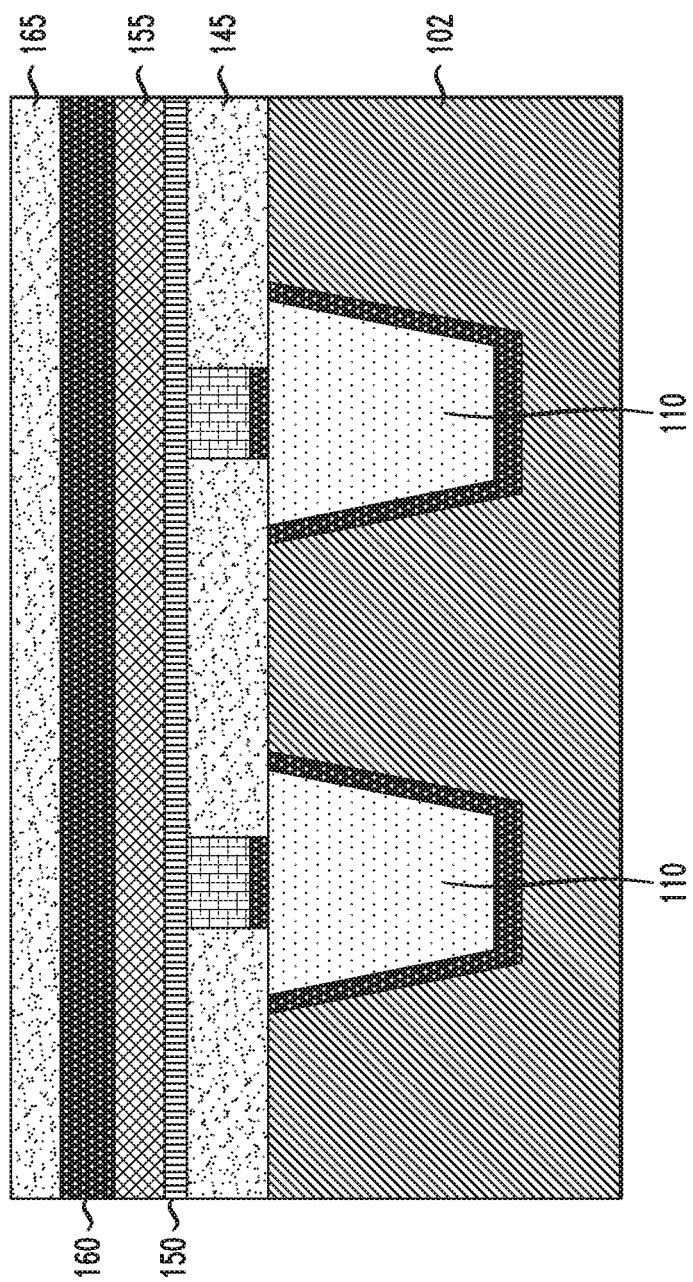
FIG. 7 is a schematic cross-sectional view illustrating manufacturing of a memory device and showing formation of a stacked structure of switching element, top electrode metal and hardmask layers, according to an embodiment of the invention.

FIG. 7 is a schematic cross-sectional view illustrating manufacturing of a memory device and showing formation of a stacked structure of switching element, top electrode metal and hardmask layers, according to an embodiment of the invention. Referring to FIG. 7, a stacked structure including a switching element layer 150, top electrode metal layer 155 and hardmask layers 160 and 165 is formed on top surface of the planarized dielectric layer 145 and the top surfaces of the second bottom electrode layers 130. According to an embodiment, the switching element layer 150 comprises a high-k dielectric, such as, for example, $HfO_2$, $Zr_2O_3$ or tantalum oxide ($TaO_x$). The top electrode layer 155 includes, for example, a trilayer structure of titanium, aluminum and titanium (Ti/Al/Ti) (e.g., titanium, aluminum stacked on titanium and titanium stacked on aluminum). Other materials for the top electrode layer 155 include, for example, TiN or platinum (Pt). Further, in accordance with an embodiment of the present invention, a first hardmask layer 160 comprises, for example, TaN, and a second hardmask layer 165 comprises, for example, SiN, or other nitride or oxide dielectric. According to an embodiment of the present invention, the layers 150, 155, 160 and 165 are deposited by one or more deposition techniques, including, but not necessarily limited to, PVD, CVD, ALD or sputtering. Thicknesses (e.g., vertical heights) of the switching element and top electrode layers 150 and 155 are about 3 nm to about 10 nm and at least about 10 nm, respectively.

Figure 8:
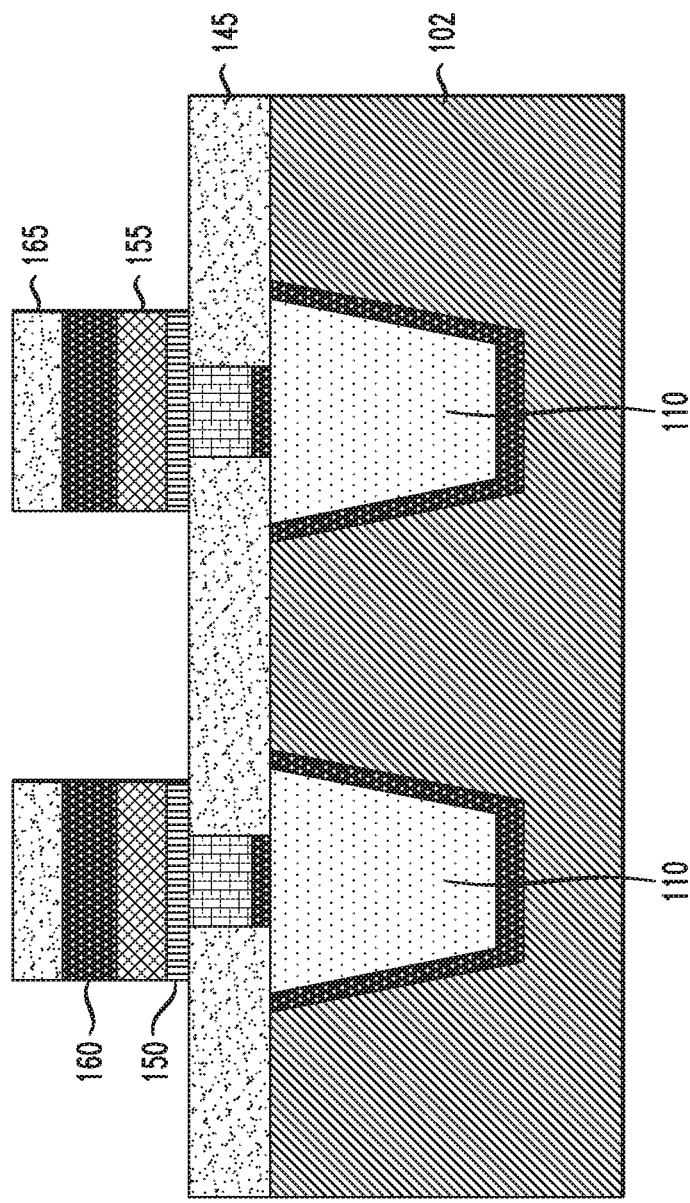
FIG. 8 is a schematic cross-sectional view illustrating manufacturing of a memory device and showing patterning of the stacked structure from FIG. 7 into pillars, according to an embodiment of the invention.

FIG. 8 is a schematic cross-sectional view illustrating manufacturing of a memory device and showing patterning of the stacked structure from FIG. 7 into pillars, according to an embodiment of the invention. Referring to FIG. 8, the stacked structure including the switching element layer 150, top electrode metal layer 155 and hardmask layers 160 and 165 is patterned into pillars over each bottom electrode structure including the remaining bottom electrode layers 125 and 130. The number of pillars shown in the figures, which correspond to the bottom electrode structures, is illustrative, and the embodiments of the present invention are not necessarily limited to the number of pillars shown.

Patterning the stacked structures into the pillars is performed using, for example, a reactive ion etching (RIE) process to remove portions of the stacked structure adjacent the pillars. The pillars are masked prior to etching. As can be seen in FIG. 8, the pillar portions, each including the patterned switching element layer 150, top electrode metal layer 155 and hardmask layers 160 and 165 have a greater horizontal width than that of their corresponding bottom electrode structures.

Due to the presence of the dielectric layer 145 protecting sides of the bottom electrode structures, there is no damage to or unwanted removal of the bottom electrode layers 125 and/or 130, which avoids shorting between the top electrodes 155 and the bottom electrode layers 125 and/or 130.

Figure 9:
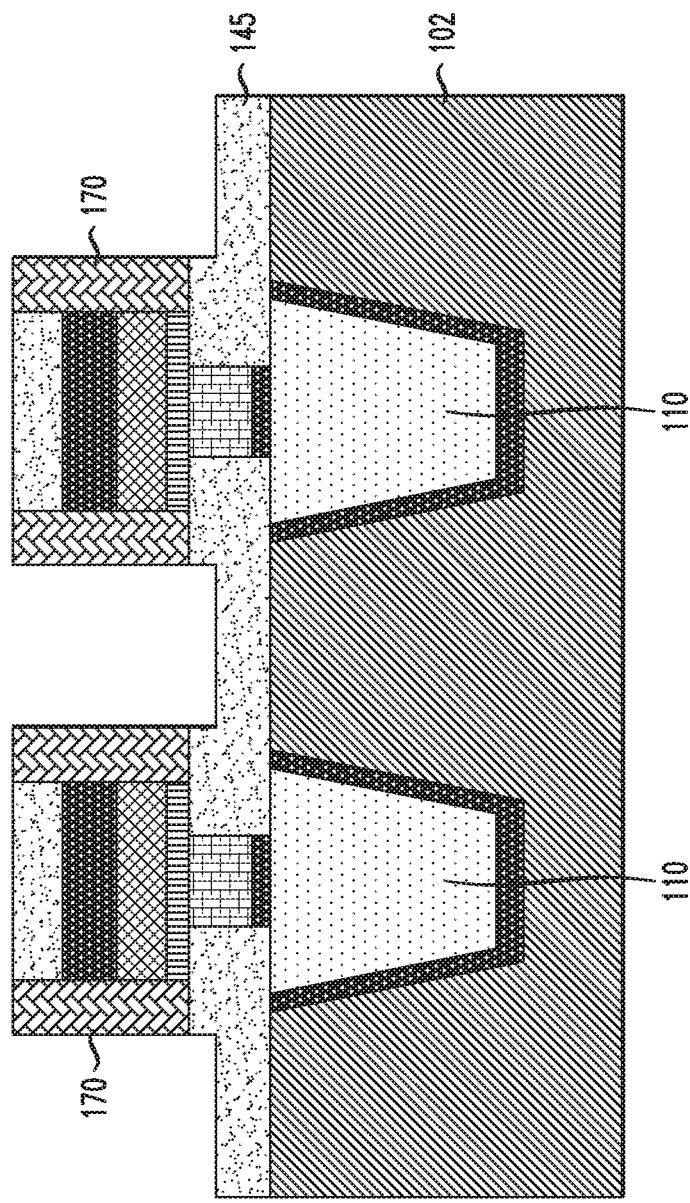
FIG. 9 is a schematic cross-sectional view illustrating manufacturing of a memory device and showing spacer formation on the pillars from FIG. 8, and recessing of portions of the conformal dielectric layer, according to an embodiment of the invention.

FIG. 9 is a schematic cross-sectional view illustrating manufacturing of a memory device and showing spacer formation on the pillars from FIG. 8, and recessing of portions of the conformal dielectric layer, according to an embodiment of the invention. Referring to FIG. 9, spacer material, such as, for example, SiOCN, SiBCN, SiOC, SiCN, SiBN, or SiON, is conformally deposited on all exposed surfaces, including on sidewalls and top surfaces of the pillars and on the dielectric layer 145. The spacer material can be deposited using conformal deposition techniques, including, but not limited to, ALD or other conformal deposition process.

A directional etch using, for example, RIE, is performed to remove portions of the spacer material from horizontal surfaces of the dielectric layer 145, and from top surfaces of the pillars to result in the spacers 170 remaining on the vertical sidewalls of the pillars. As can be seen in FIG. 9, the RIE process results in recessing of portions of the dielectric layer 145 between and adjacent the pillars to a lower height than the portions of the dielectric layer 145 under the spacers 170. In accordance with an embodiment of the present invention, the spacers 170 do not comprise an oxide.

Figure 10:
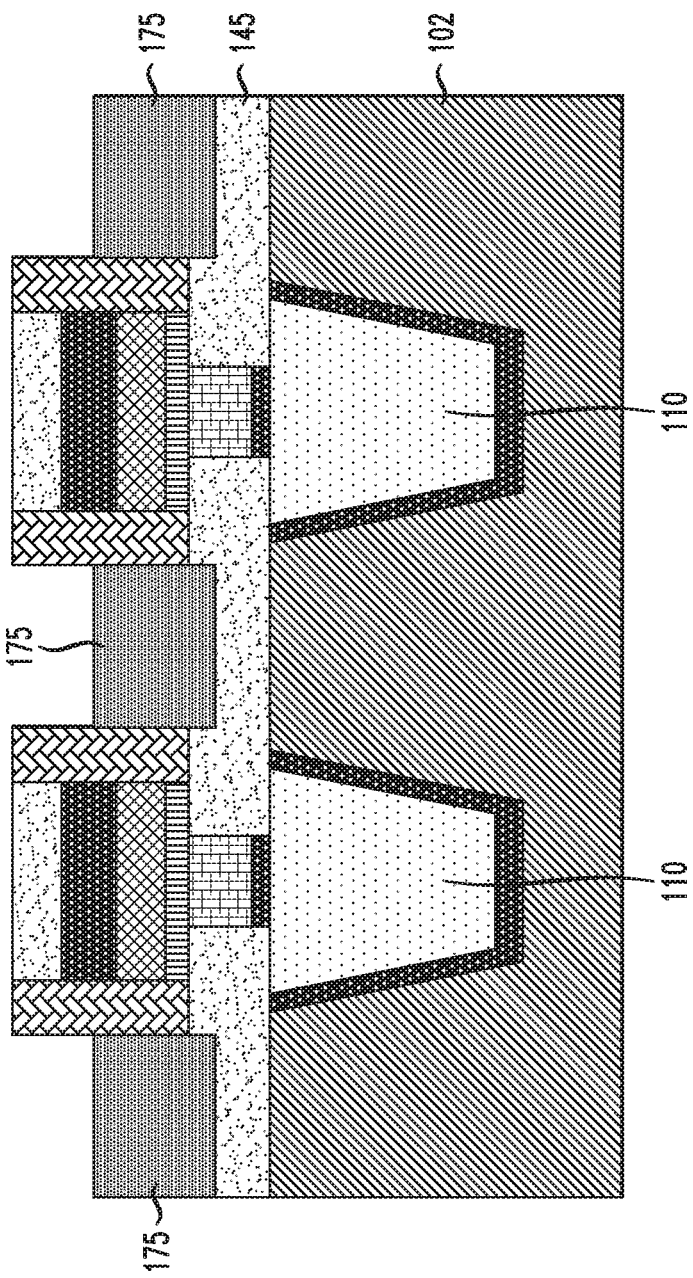
FIG. 10 is a schematic cross-sectional view showing gate metal deposition and recessing on the recessed portions of the conformal dielectric adjacent the pillars, according to an embodiment of the invention.

FIG. 10 is a schematic cross-sectional view showing gate metal deposition and recessing on the recessed portions of the conformal dielectric adjacent the pillars, according to an embodiment of the invention. Referring to FIG. 10, gate metal layer 175 is deposited on the recessed portions of the dielectric layer 145 adjacent the pillar portions including the spacers 170 formed thereon. The gate metal layer 175 includes, for example, an electrically conductive metal such as tungsten, TiN, or copper and is deposited using, for example, deposition techniques including, but not necessarily limited to, CVD, plasma-enhanced CVD (PECVD), radio-frequency CVD (RFCVD), PVD, ALD, molecular layer deposition (MLD), molecular beam deposition (MBD), pulsed laser deposition (PLD), liquid source misted chemical deposition (LSMCD), sputtering, and/or plating. A planarization process, such as, for example, CMP, can be performed to remove excess portions of the gate metal layer 175 on the top surfaces of the spacers 170 and the hardmask layers 165.

The gate metal layer 175 is recessed to the height shown in FIG. 10 using, for example, an anisotropic etch process, such as RIE, ion beam etching, plasma etching or laser ablation. According to an embodiment, recessing is performed by a wet or dry etching process that is selective with respect to materials of the spacers 170 and the hardmasks 165. The spacers 170 and the hardmasks 165 may include the same or similar material, such as, for example, a nitride. Etch chemistry for recessing the gate structure can include, for example, sulfur hexafluoride ($SF_6$) and nitrogen ($N_2$).

The gate metal layer 175 functions as a third electrode around memory cell structures (e.g., RRAM cell structures) each including a top electrode 155, switching element 150 and bottom electrode 130, 125. The gate metal layer 175 introduces a lateral electric field which modulates the trajectories of metal ions to control filament formation location in the memory cell structures. More specifically, the gate metal layer 175 functions as a focusing electrode to limit filament growth to the center of the memory cell, which minimizes edge effects. In accordance with an embodiment of the present invention, the gate metal layer 175 is provided as an additional metal electrode surrounding the memory cells including the switching mediums, whose lateral electric field can be tuned by applying proper voltage.

For set/reset operations, embodiments of the present invention suppress filament growth (e.g., rupture) by applying an electric field from the gate metal layer in the opposite direction of filament growth to push oxygen vacancies to the center of the memory cells (e.g., center of the switching layer) and alleviate abrupt filament geometry changes. In accordance with one or more embodiments of the present invention, the gate metal layer 175 forms a ring-shaped electrode around the memory cells to control filament formation and location in the switching layers 150.

Figure 11:
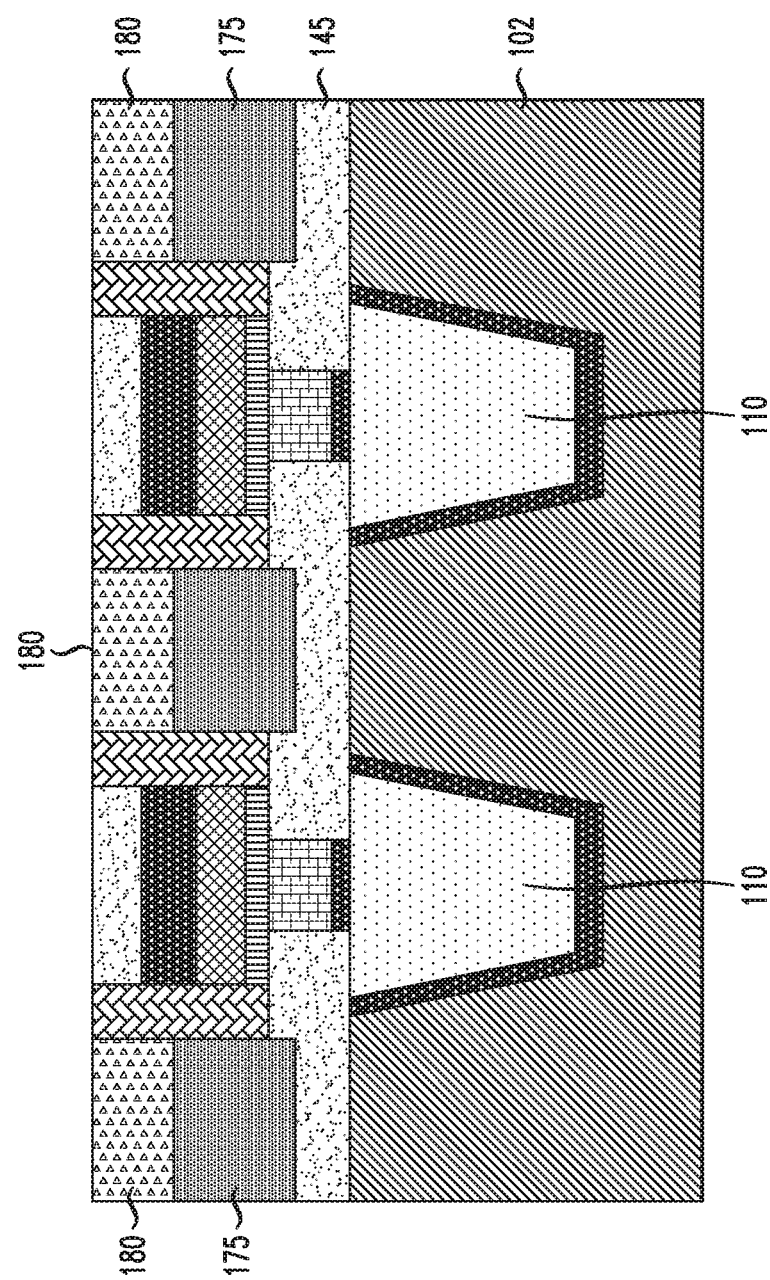
FIG. 11 is a schematic cross-sectional view illustrating manufacturing of a memory device and showing inter-layer dielectric deposition and planarization, according to an embodiment of the invention.

FIG. 11 is a schematic cross-sectional view illustrating manufacturing of a memory device and showing inter-layer dielectric deposition and planarization, according to an embodiment of the invention. Referring to FIG. 11, after recessing of the gate metal layer 175, an inter-level dielectric (ILD) layer 180 comprising, for example, silicon oxide (SiOx), silicon oxycarbide (SiOC), silicon oxycarbonitride (SiOCN) or some other dielectric is formed on the exposed portions of the structure including the top surfaces of the recessed gate metal layer 175, the spacers 170 and the hardmask layers 165. The ILD layer 180 is deposited using a deposition process, such as, for example, CVD, PECVD, PVD, ALD, MBD, PLD, LSMCD, and/or spin-on coating. The deposited ILD layer 180 is planarized down to the hardmask layers 165 and spacers 170 using a planarization process, such as, for example, CMP.

Figure 12:
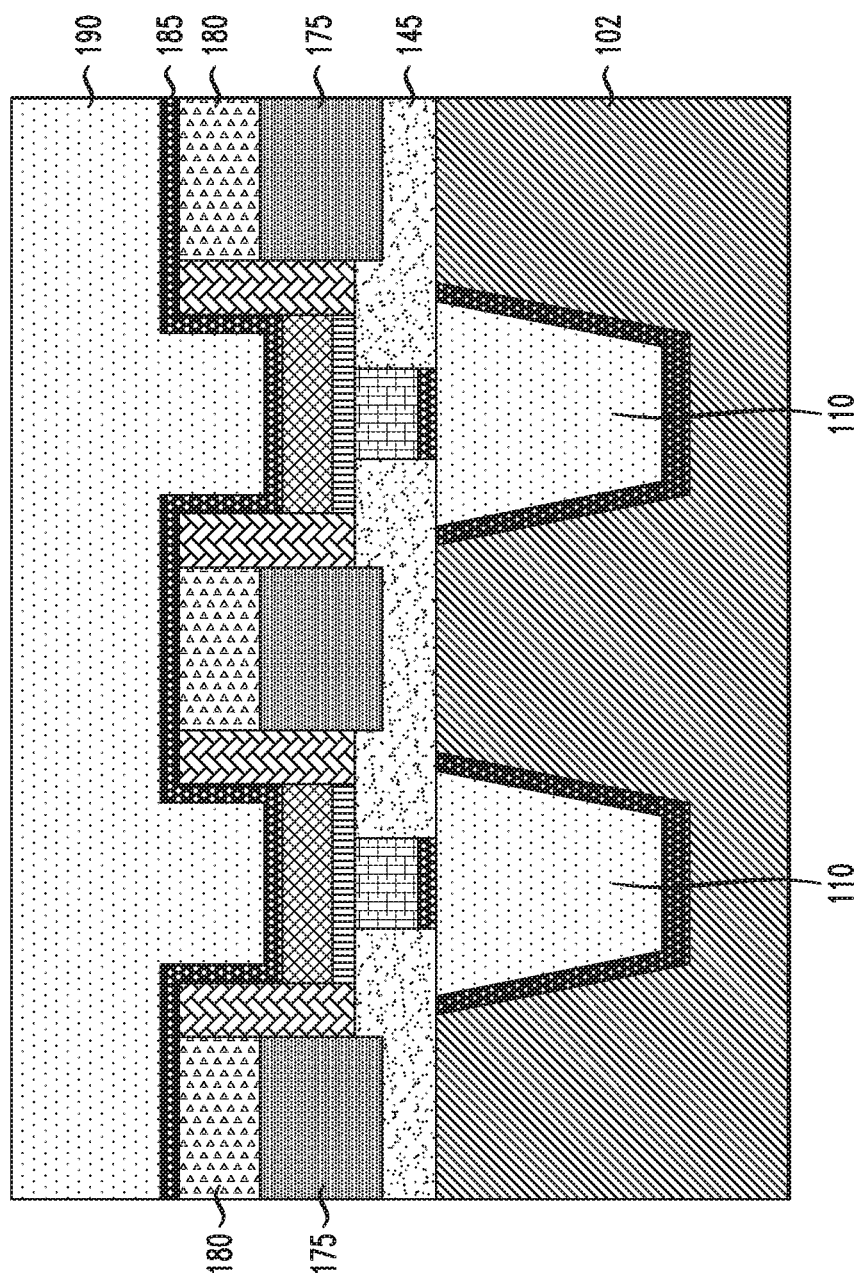
FIG. 12 is a cross-sectional view illustrating hardmask removal and top contact formation, according to an embodiment of the invention.

FIG. 12 is a cross-sectional view illustrating hardmask removal and top contact formation, according to an embodiment of the invention. Referring to FIG. 12, the hardmask layers 160 and 165 are removed from between the spacers 170. The removal process is performed to remove the hardmask layers 160 and 165, while the spacer and ILD layers 170 and 180 remain.

Following removal of the hardmask layers 160 and 165, a barrier layer 185 comprising, for example tantalum nitride, is conformally formed on top surfaces of the ILD, spacer and top electrode layers 180, 170 and 155, and on side surfaces of the spacer layers 170. Deposition can be performed using, for example, ALD or other conformal deposition process.

A top contact 190 including, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof are deposited on the barrier layer 185 using deposition techniques, including, but not necessarily limited to, PVD, CVD, ALD or sputtering. The electrically conductive material of the top contact 190 fills in the areas where the hardmasks 160 and 165 were removed, and is deposited to a height above the top surfaces of the ILD and spacer layers 180 and 170 as shown in FIG. 12. Referring to FIG. 13, top contacts 190 form contact lines, such as, for example, bit lines, of a resulting memory cell array 200. The number of top contacts 190 shown in the figures is illustrative, and the embodiments of the present invention are not necessarily limited to the number of contacts shown.

FIG. 13 is a schematic top view of an array of memory cells, according to an embodiment of the invention. Referring to FIG. 13, in general, an array 200 of memory cells 195, for example, RRAM memory cells 195, includes a plurality of top contacts 190 oriented perpendicularly with respect to the bottom contacts 110. For example, referring to the cross-sectional views in FIGS. 1-12, the bottom contacts 110 can be viewed as extending into and out of the page, while the top contacts can be viewed as extending in the left and right directions along the page. Each of the memory cells 195 includes the top electrode 155, the switching element layer 150 and the bottom electrode layers 125, 130. The gate metal layer 175 surrounds the memory cells 195, and as explained herein above, functions as a third electrode around memory cells 195 to limit filament growth to the center of the memory cells 195. The lateral electric field of the gate metal layer 175 can be tuned by applying proper voltage, and is applied in the opposite direction of filament growth to push oxygen vacancies to the center of the memory cells (e.g., center of the switching element layers) and limit lateral filament growth.

In accordance with an embodiment of the present invention, the memory cell array 200 is in a 3D cross-bar structure.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:
   forming a bottom electrode on a bottom contact layer;
   forming a dielectric layer covering sides of the bottom electrode;
   depositing a switching element layer on the dielectric layer and the bottom electrode;
   depositing a top electrode layer on the switching element layer;
   depositing a hardmask layer on the top electrode layer;
   patterning the switching element layer, the top electrode layer and the hardmask layer into a pillar on the bottom electrode;
   forming a spacer layer on the dielectric layer on sides of the pillar;
   forming a metal layer on the dielectric layer adjacent the spacer layer and around the pillar; and
   recessing the metal layer to a height less than a height of the pillar.

2. The method according to claim 1, wherein a width of the pillar is greater than a width of the bottom electrode.

3. The method according to claim 1, wherein the bottom electrode comprises first and second metal nitride layers deposited by physical vapor deposition (PVD).

4. The method according to claim 3, wherein the first metal nitride layer comprises tantalum nitride (TaN) and the second metal nitride layer comprises titanium nitride (TiN).

5. The method according to claim 3, further comprising patterning the first and second metal nitride layers into the bottom electrode.

6. A method for manufacturing a semiconductor memory device, comprising:
   forming a bottom electrode on a bottom contact layer;
   forming a dielectric layer covering sides of the bottom electrode;
   depositing a switching element layer on the dielectric layer and the bottom electrode;
   depositing a top electrode layer on the switching element layer;
   depositing a hardmask layer on the top electrode layer;
   patterning the switching element layer, the top electrode layer and the hardmask layer into a pillar on the bottom electrode;
   forming a spacer layer on the dielectric layer on sides of the pillar;
   forming a metal layer on the dielectric layer adjacent the spacer layer and around the pillar;
   wherein the bottom electrode comprises first and second metal nitride layers deposited by physical vapor deposition (PVD); and
   patterning the first and second metal nitride layers into the bottom electrode;
   wherein the patterning of the first and second metal nitride layers comprises forming a mask on a portion of the first and second metal nitride layers and removing an unmasked portion of the first and second metal nitride layers.

7. The method according to claim 1, wherein the dielectric layer is deposited on the bottom electrode by atomic layer deposition.

8. The method according to claim 7, further comprising planarizing the dielectric layer to expose a top surface of the bottom electrode.

9. The method according to claim 1, wherein the switching element layer comprises a high-k dielectric.

10. The method according to claim 1, wherein the top electrode layer comprises a trilayer structure of a first titanium layer, an aluminum layer stacked on the first titanium layer and a second titanium layer stacked on the aluminum layer.

11. The method according to claim 1, further comprising depositing an inter-layer dielectric layer on the metal layer.

12. The method according to claim 11, further comprising removing the hardmask layer from the pillar.

13. The method according to claim 12, further comprising forming a top contact layer on the top electrode layer of the pillar.

* * * * *